United States Patent [19]

Yoshii et al.

[11] Patent Number: 5,081,520
[45] Date of Patent: Jan. 14, 1992

[54] CHIP MOUNTING SUBSTRATE HAVING AN INTEGRAL MOLDED PROJECTION AND CONDUCTIVE PATTERN

[75] Inventors: Masayuki Yoshii; Yoshiyuki Mizumo; Shunji Oku; Mika Kowa, all of Osaka, Japan

[73] Assignee: Minolta Camera Kabushiki Kaisha, Osaka, Japan

[21] Appl. No.: 525,082

[22] Filed: May 16, 1990

[30] Foreign Application Priority Data

May 16, 1989 [JP] Japan .................. 1-122233
Apr. 26, 1990 [JP] Japan .................. 2-113030

[51] Int. Cl.⁵ .................. H01L 23/12; H01L 23/14
[52] U.S. Cl. .................. 357/80; 357/68
[58] Field of Search .......... 357/67, 74, 72, 80, 357/68, 76; 174/260, 261, 263, 255; 361/404, 406

[56] References Cited

U.S. PATENT DOCUMENTS

| | | | |
|---|---|---|---|
| 4,143,385 | 3/1979 | Miyoshi et al. | 357/67 |
| 4,483,067 | 11/1984 | Parmentier | 357/72 |
| 4,494,688 | 1/1985 | Hatada et al. | 228/180.2 |
| 4,928,387 | 5/1990 | Mather et al. | 174/263 |
| 4,940,181 | 7/1990 | Juskey, Jr. et al. | 174/263 |
| 4,955,132 | 9/1990 | Ozawa | 174/260 |

FOREIGN PATENT DOCUMENTS 59-139636  8/1984 Japan .
60-58645   4/1985 Japan .
60-206035 10/1985 Japan .
60-207397 10/1985 Japan .
60-262430 12/1985 Japan .
61-833     1/1986 Japan .
61-212030  9/1986 Japan .
61-287238 12/1986 Japan .

OTHER PUBLICATIONS

Hamatight M Series (The Yokihama Rubber Co., Ltd.).
MOFIT HM-1000 (Osaka Soda Co., Ltd.).
Hitachi Chemical Semiconductor Device (Hitachi Chemical Co., Ltd.).

Primary Examiner—Rolf Hille
Assistant Examiner—S. V. Clark
Attorney, Agent, or Firm—Price, Gess & Ubell

[57] ABSTRACT

The present invention provides an improved chip mounting method for mounting an IC chip on a substrate, comprising the steps of; integrally molding a projection on the substrate, the projection being located on a surface of the substrate on which the IC chip will be mounted; forming a conductive pattern on the projection and on a necessary portion of the substrate; forming a connecting layer on the conductive pattern formed on the projection; and fixing said IC chip on the substrate while electrically connecting an exposed electrode of the IC chip with the conductive pattern formed on the projection through the connecting layer.

18 Claims, 8 Drawing Sheets

CHIP MOUNTING SUBSTRATE HAVING AN INTEGRAL MOLDED PROJECTION AND CONDUCTIVE PATTERN

BACKGROUND OF THE INVENTION

1. Field of the Invention

The present invention relates to a method for mounting an IC chip on a substrate on which at least one conductive pattern to be connected with the IC chip is formed, and more particularly to a substrate having an IC chip mounted by the method.

2. Description of the Prior Art

The known methods for directly mounting an IC chip on a printed circuit substrate include a wire bonding method in which an IC chip is fixed on a printed circuit substrate, and thereafter the electrodes of the IC chip are connected with corresponding connection patterns by respective wires; and the face down bonding method in which the electrodes of the IC chip are faced to the printed circuit substrate and are fixed thereto by electrically connecting the electrodes with the printed circuit substrate through bump-like members. (protrusive electrodes).

In the wire bonding method, since wires should be respectively bonded to IC chip electrodes, the number of processes increases with the number of electrodes.

In addition, there is the possibility of short circuits occuring between wires in an IC chip having electrodes at close intervals.

In the face down bonding method, bumps (protrusive electrodes) are formed on either an IC chip or a printed circuit substrate, and exposed electrodes are provided at positions corresponding to the bumps so as to butt against the bumps. Then, respective bumps are faced to corresponding exposed electrodes and squashed by being pressed to be glued on the exposed electrodes tightly, thereby improving the electrical connection.

Conventionally, there is also known a method for directly forming the bumps on the IC chip by plating gold on the exposed electrodes of the IC chip or by evaporating gold thereon, and another method for transferring bumps preliminarily formed on another substrate to the IC chip or printed circuit substrate by heat and pressure. But when directly forming bumps on IC chips, the processes of gold plating or gold evaporation were added and the yield of the IC chips decreased.

When transferring bumps formed on another substrate to IC chips by heat and pressure, the processes of exposing the IC chip to much higher temperatures than the usual hardening temperature of sealing resin, and applying high pressure were essential, therefore generating stress on the IC chips and decreasing the yield.

When transferring bumps formed on another substrate to a printed circuit substrate by heat and pressure, it is necessary to use materials resistant to heat for transfer to the printed circuit substrate, and the cost of the substrate is raised.

Conventionally, IC packages have been employed to mount an IC chip on an uneven printed circuit substrate. However, this has proved disadvantageous because an IC package makes the whole device large. Especially when an IC chip is mounted on molded components, the high-density mounting of the IC chip is required for minimizing the size of devices. Accordingly, the development of a method for mounting IC chips directly on substrates has been desired.

SUMMARY OF THE INVENTION

An object of the present invention is to provide an improved chip mounting method of relatively low cost and having high reliability.

Another object of the present invention is to provide an improved chip bonding method having a decreased number of steps in comparison with a known conventional chip mounting method.

A further object of the present invention is to provide an improved chip bonding method suitable for mounting, on a substrate, an IC chip operating as an optical element.

Another object of the present invention is to provide an improved chip bonding method effective for making a device, including an IC chip bonded on a substrate, compact.

A further object of the present invention is to provide an improved chip mounting method effective for making its bonding operation simple.

Another object of the present invention is to provide a substrate suitable for the improved chip mounting method.

In order to accomplish these and other objects, the present invention provides a chip mounting method comprising the steps of: integrally molding a projection on the substrate, said projection being located on a surface of the substrate on which the IC chip will be bonded; forming a conductive pattern on the projection and on a necessary portion of the substrate; forming a connecting layer on the conductive pattern formed on the projection; and fixing said IC chip on the substrate while electrically connecting an exposed electrode of the IC chip with said conductive pattern formed on the projection through said connecting layer.

Furthermore, the present invention provides a chip mountable substrate comprising: a substrate; a projection integrally formed on the substrate, said projection being located on a position on which the exposed electrode of the IC chip will be positioned when the IC chip is bonded on the substrate; and a conductive pattern located on the projection and on a necessary portion of the substrate.

The features of the present invention which are believed to be novel are set forth with particularity in the appended claims. The present invention, both as to its organization and manner of operation, together with further objects and advantages thereof, may best be understood by reference to the following description, taken in conjunction with the accompanying drawings.

DETAILED DESCRIPTION OF THE PREFERRED EMBODIMENTS

The following specification, taken in conjunction with the drawings, sets forth the product of the present invention in such a manner to enable any person skilled in the art to utilize the invention. The embodiments of the invention disclosed herein are the best modes contemplated by the inventors of carrying out their invention in a commercial environment, although it should be understood that various modifications can be accomplished within the parameters of the invention.

Figure 1:
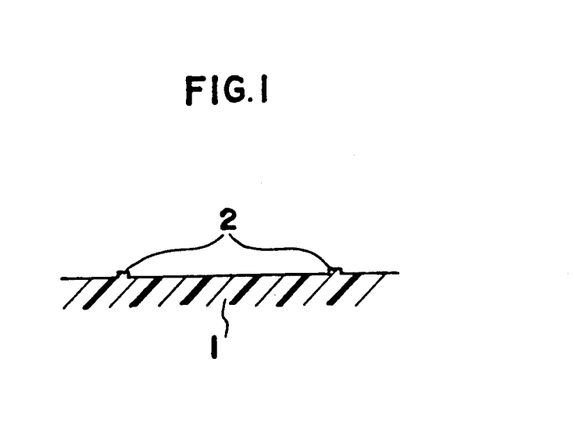
FIGS. 1 to 3 represent respective steps according to a first embodiment of a chip mounting method of the present invention.
Figure 2:
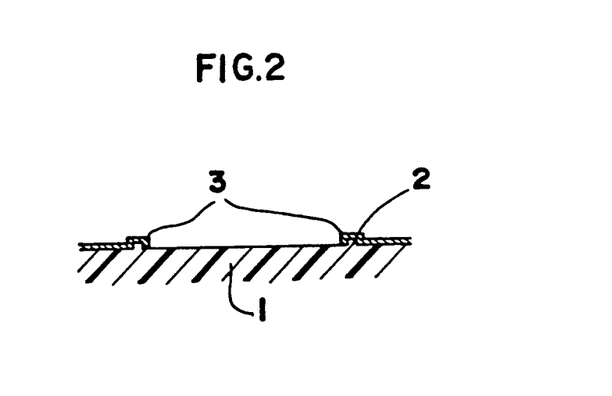
Figure 3:
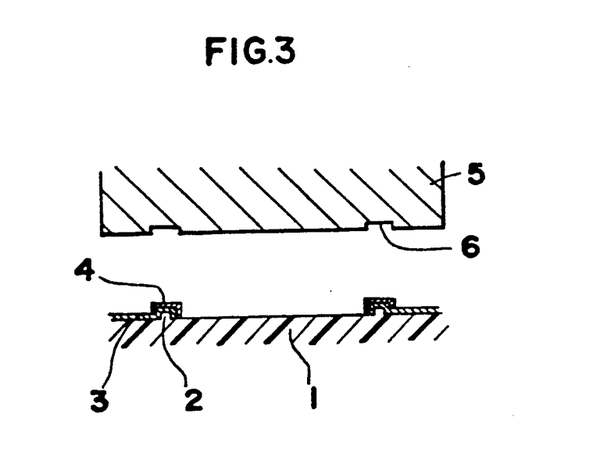

FIGS. 1 to 3 represent a first embodiment of the present invention. In FIGS. 1 to 3, 1 is a plastic-molded substrate. Projections 2, molded integrally with the substrate, are formed at the positions corresponding to exposed electrodes 6 on an IC chip 5 which is to be mounted on this substrate. FIG. 2 represents the formation of conductive patterns 3 on said projections 2.

The conductive patterns 3 are formed by printing conductive paste on a plastic-molded substrate, by transferring a desired conductive patterns 3 which are preliminarily drawn on a film to a plastic-molded substrate 1, or by setting film, on which desired patterns have been drawn in a mold to be used for forming the substrate 1, and bonding the conductive patterns 3 on the surface of the substrate 1 when the substrate 1 is formed by using the mold.

FIG. 3 represents the formation of connecting layers 4 by further plating the conductive patterns 3 on projections 2 with gold, or by coating it with gold paste. Bumps are composed of projections 2, conductive patterns 3 and connecting layers 4 as stated above. IC chip 5 has a cover layer on its surface and the cover layer has openings at positions corresponding to the electrodes 6.

Figure 4:
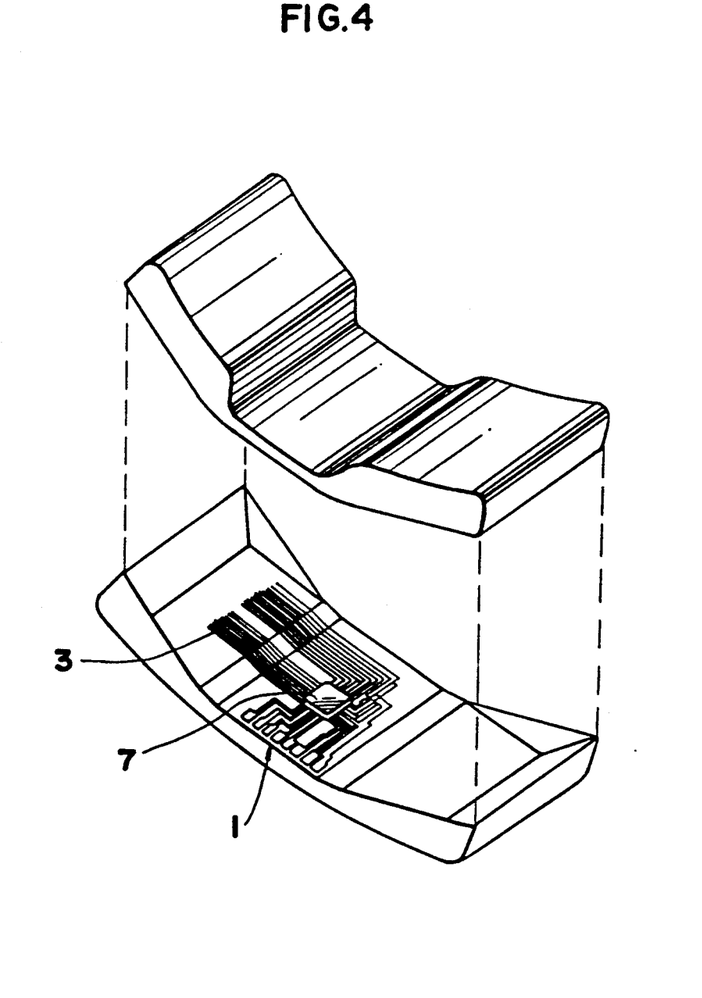
FIG. 4 represents an example of a product incorporating the first embodiment.

FIG. 4 represents an example of a product using the embodiment shown in FIGS. 1 to 3. The bumps (projections 2, conductive patterns 3, and connecting layers 4) are formed on the plastic-molded substrate 1 by the aforementioned method at a position facing the pads (exposed electrodes) 6 of the IC chip 5. By locating the IC chip 5 at a specific position, and pressing the bumps against the pads 6 on the IC chip 5, the bumps are bonded to the pads 6. The insulated faces of the IC chip 5 and molded substrate 1 which are pressed against each other are coated with an adhesive, and the IC chip 5 is fixed on the molded substrate 1. The IC chip 5 is sealed with resin thereafter. In FIG. 4, 7 represents the sealed IC chip.

The molded substrate 1 of the product shown in FIG. 4 is shaped as an outside member of telephone receiver.

Figure 5:
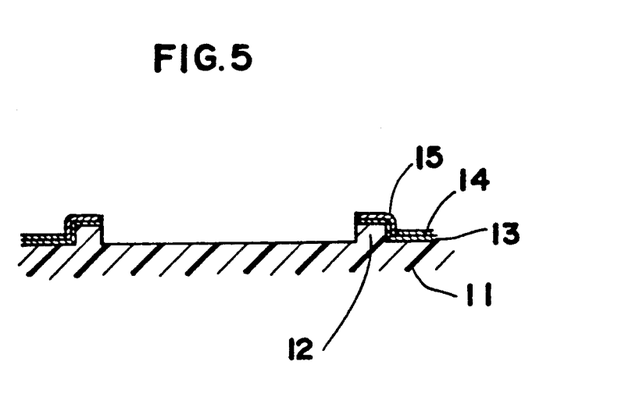
FIGS. 5 to 7 represent respective steps according to a second embodiment of a chip mounting method of the present invention.
Figure 6:
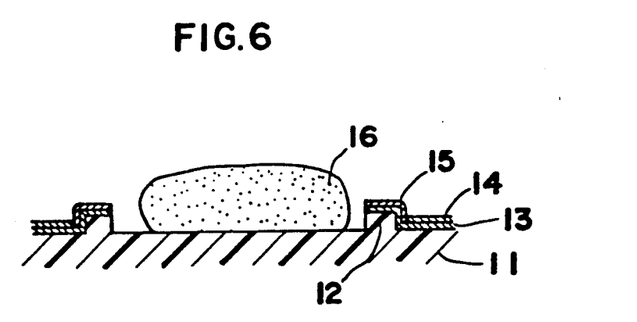
Figure 7:
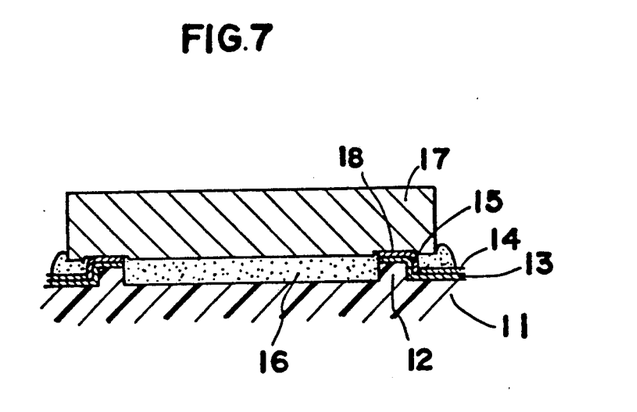

FIGS. 5 to 7 represent a second embodiment of the present invention. In FIG. 5, 11 is the plastic-molded substrate, which is molded integrally with projections 12 for bumps connecting an IC chip. As materials for the substrate, epoxy thermosetting resins, thermoplastic resins such as polyphenylene sulfide (PPS) and liquid crystal polymers can be used. Conductive (wiring) patterns 13 are formed on the surface of said projections 12. A cover layer 14 is provided on the substrate 11, except for that part of the conductive patterns 13 with the projections 12. Connecting layers 15 cover the conductive patterns 13 on the projections 12. The connecting layers 15 can be made of solder, tin, plated-gold, gold-paste or conductive adhesive. FIG. 6 represents the appropriate application of adhesive 16 at the position on the substrate 11 where an IC chip is to be mounted. In FIG. 7, an IC chip 17 has a cover layer on its lower surface, and the cover layer has openings at the position corresponding to the projections 12. Pads (exposed electrodes) 18 of the IC chip 17 are formed on positions corresponding to the openings of the cover layer. The IC chip 17 and the substrate 11 are faced to each other so that the pads 18 of the IC chip 17 are respectively fitted to corresponding conductive patterns 13 on the projections 12. Heat and pressure are applied to the faced portions thereafter to meet the material forming the connecting layer 15, such as solder or tin, which establishes the electrical connection between the circuit provided in the IC chip 17 and circuit connected through the conductive patterns 13 of the substrate 11. At the same time, the adhesive 16 is spread out on the entire lower face of the IC chip 17. When it is hardened by heat, the IC chip 17 is fixed on the substrate 11 by the hardened adhesive 16, and its circumference is sealed thereby as shown in FIG. 7.

Here, the heating temperature required for hardening the adhesive 16 is much lower than the temperature when transferring the bumps and therefore does not adversely affect the IC chip and the substrate.

In case of using a hot-melt type thermoplastic adhesive in the place of the epoxy thermosetting adhesive as the adhesive 16 in the above embodiment, the adhesive 16 cures when cooled and the IC chip is sealed on the substrate 11, and can be softened when heated again. Consequently, it becomes possible to easily detach the IC chip 17 from the substrate by heating. When the adhesive is cooled again, the replaced IC chip 17 is sealed again on the substrate 11.

Figure 8:
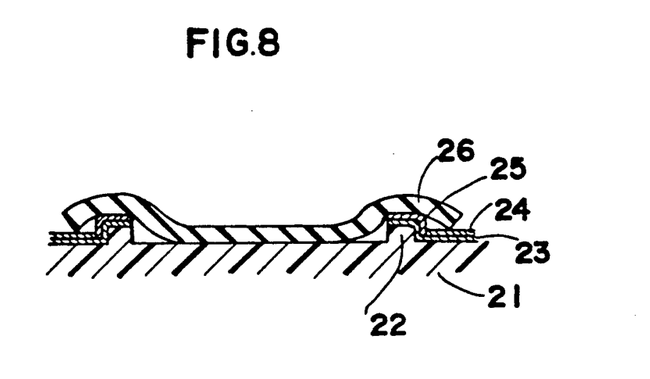
FIGS. 8 and 9 represent respective steps according to a third embodiment of a chip mounting method of the present invention.
Figure 9:
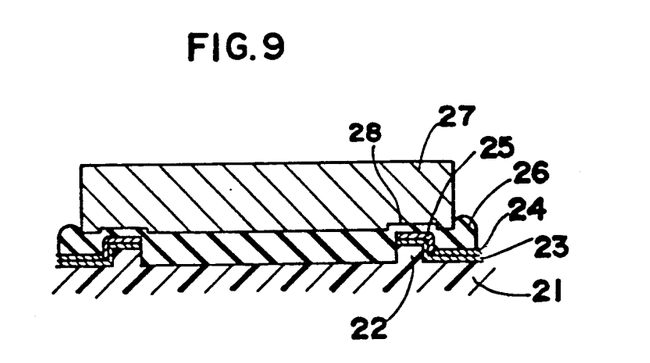

FIGS. 8 and 9 represent a third embodiment in which an IC chip 27 is mounted on a substrate 21 by using anisotropic conductive adhesive tape 26 instead of the adhesive 16. FIG. 8 represents the location of the anisotropic conductive adhesive tape 26 on the entire part of the surface to which the IC chip is mounted. In FIG. 8, 24 represents cover layers which are the same as the cover layers 14 shown in FIGS. 5 to 7, and 25 represents connecting layers same as the connecting layers shown in FIGS. 5 to 7. In FIG. 9, the IC chip 27 is located so that its pads 28 correspond to conductive patterns 23 on projections 22, and is pressed against the substrate 21 and heated, so that the anisotropic conductive tape 26 melts by heat and thus secures the IC chip 27 to the substrate 21. The pad 28 and the conductive patterns 23 on the projection 22 are electrically connected by pressing, and the press-fitted connection shows electrical conductivity. Thus, the IC chip 27 is mounted on the substrate 21.

The anisotropic adhesive tape shows low electrical resistance in the pressing direction, that is, in a direction of its thickness, while it shows high electrical resistance in its orthogonal direction. Therefore, even though the tape covers the entire lower surface of the IC chip, the pads 28 on the IC chip 27 are electrically connected only to their corresponding projections 22, but not to the adjacent pads.

Figure 10:
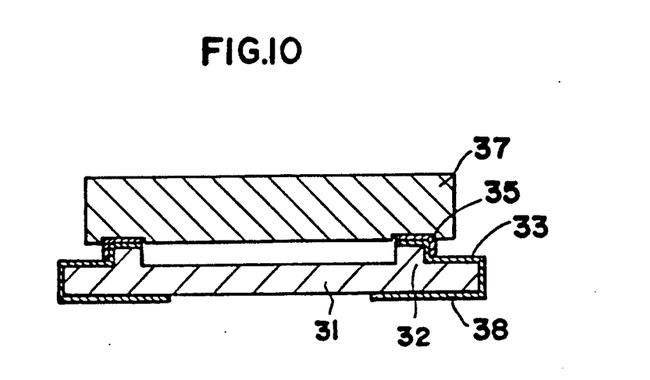
FIGS. 10 and 11 represent respective steps according to a fourth embodiment of a chip mounting method of the present invention.
Figure 11:
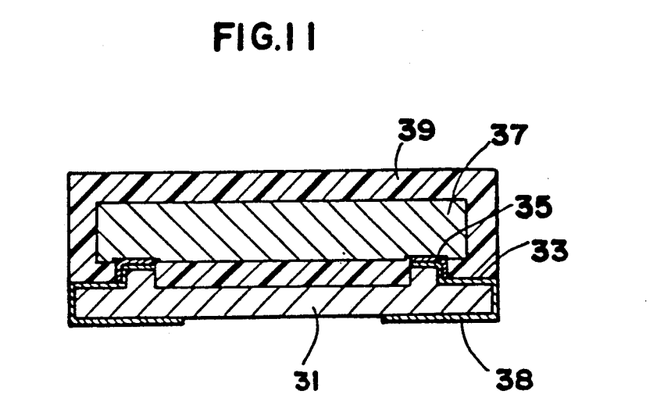

FIGS. 10 and 11 represent a fourth embodiment of connecting an IC chip 37 to projections 32 provided on a substrate 31 by heating and pressing without using adhesive 16, and surrounding the IC chip 37 with a mold and feeding resin 39 to the mold so as to seal the IC chip on the substrate 31. The IC package shown in FIG. 11 is thus formed. Conductive patterns 33 formed on the substrate 31 extends out to the rear face of the substrate 31, and the extended portions 38 serves as external electrodes which are connected to electrodes on other circuit parts. 35 represents connecting layers explained above.

Figure 12:
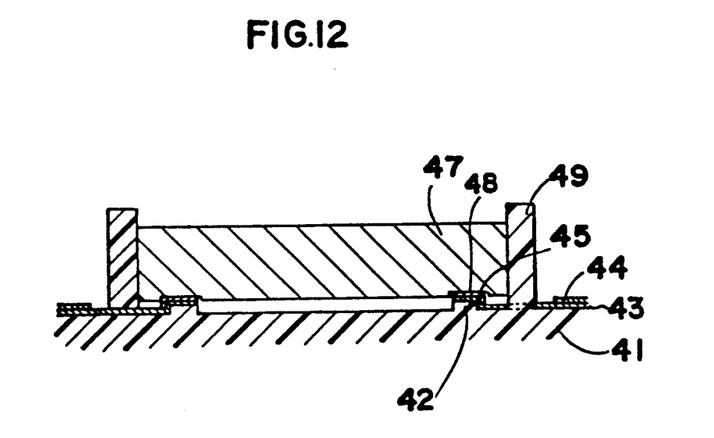
FIGS. 12 to 14 represent respective steps according to a fifth embodiment of a chip mounting method of the present invention.
Figure 13:
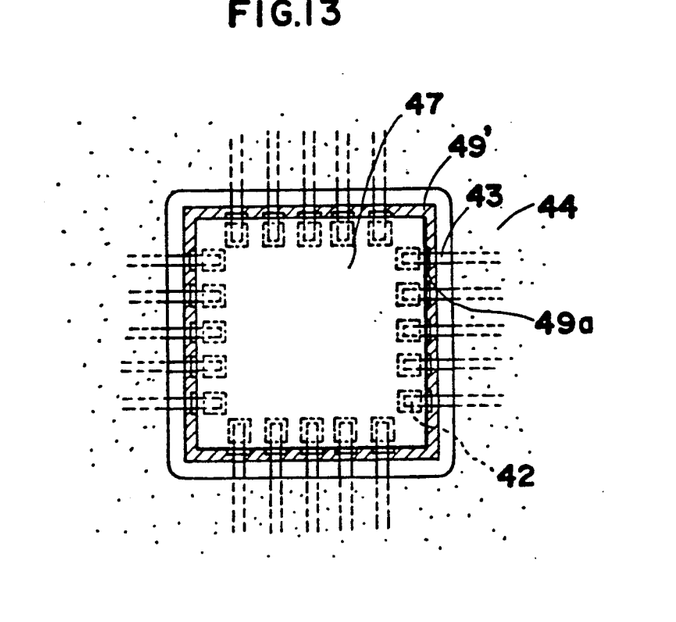
Figure 14:
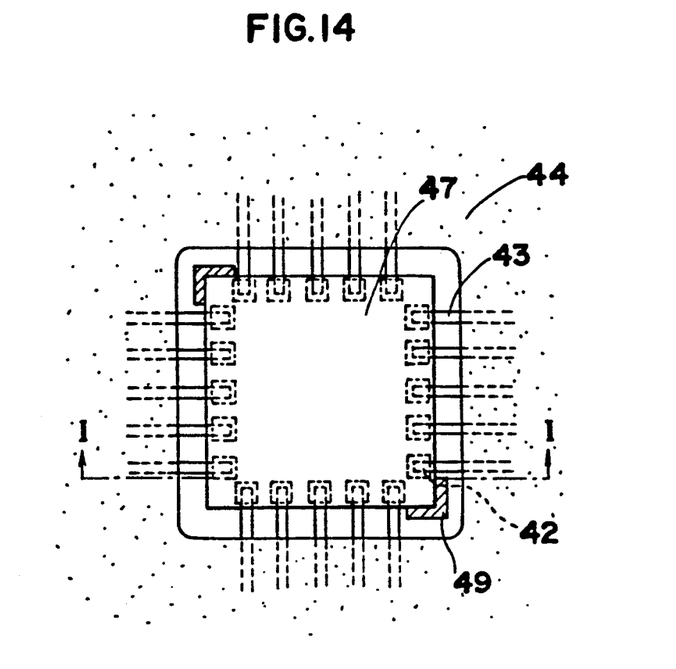

FIGS. 12 to 14 represent a fifth embodiment in which a positioning frame 49 of an IC chip 47 is molded integrally with a substrate 41. FIG. 12 represents the condition in which the IC chip 47 is mounted on the substrate 41, and is a sectional view taken along the line I—I of FIG. 14. The positioning frames 49 are formed on two corners of the IC chip to be mounted as shown in FIG. 14. This makes it easy to correctly position the pads 48 and conductive patterns 43 on the projections 42 of the substrate 41. In FIGS. 12 to 14, 44 represents cover layers same as the cover layers 14 shown in FIGS. 5 to 7, and 45 represents connecting layers same as the connecting layers shown in FIGS. 5 to 7. The positioning frame 49 can be further used as a molding frame 49' for sealing resin when disposed so as to surround the entire circumference of the IC chip to be mounted, as shown in FIG. 13. In FIG. 13, 49a represents a recessed portion of the positioning frame 49, provided for each conductive pattern 43.

The positioning frame 49 is molded integrally with the substrate 41 in the embodiments shown in FIGS. 12 to 14. It is also possible to mold the substrate and frame separately and to attach the frame to the substrate thereafter by fitting the respective parts with each other.

Figure 15:
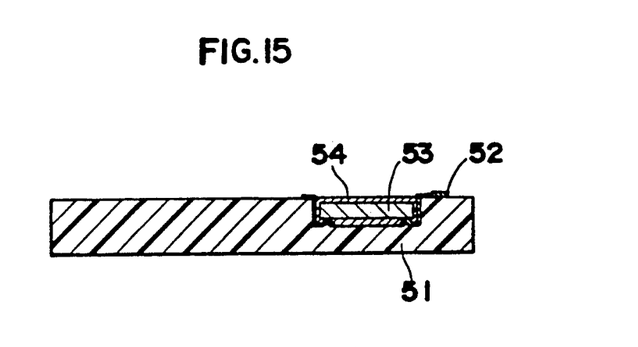
FIG. 15 represents a cross-sectional view of a substrate on which a IC chip is mounted.

FIG. 15 shows an embodiment of a substrate 51 which was developed as a commercial product or part by itself by molding the substrate 51 in various shapes. The substrate 51 on which the IC chip 53 is mounted is designed to be used by itself as an IC card. The substrate 51 has a recess for mounting the IC chip in the depth so that, when mounting, the surface of the sealing resin 54 of the IC chip will be the same level as the surface of the substrate 51. In addition, a conductive pattern on a projection is extended out to the surface of the substrate and serves as an external electrode 52 on the surface of the substrate. When this IC card is set in a device, this electrode 52 serves as a connection terminal between the IC chip 53 and a circuit on the device. As a result, the substrate in which the IC chip is embedded can be used by itself as an IC card.

If a substrate is shaped as an outside member of an electric device, the substrate in which an IC chip is embedded can be used by itself as the outside member.

Figure 16:
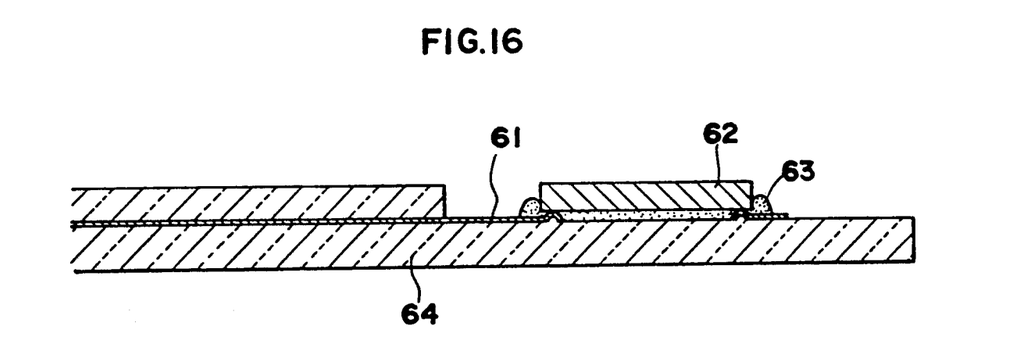
FIG. 16 represents a cross-sectional view of another substrate on which an IC chip is mounted.

FIG. 16 represents an embodiment of a directly mounted IC chip 62 on a liquid crystal display(LCD) using a substrate 64 as a part of the transparent member of the LCD. Since liquid crystal sealed in the LCD, boils at 100° C. or higher, it is impossible to heat the substrate 64 to the curing temperature of ordinary sealing resin. Then, to mount the IC chip 62 on the substrate 64, an ultraviolet-ray-setting adhesive 63 is applied where the IC chip is to be mounted, and the adhesive 63 is exposed to ultraviolet light through the substrate 64 and hardened, thus sealing the IC chip 62 on the substrate 64. In this case, the electrical connection between the pad of the IC chip and the projection on the substrate is established not by solder or conductive adhesive, but by merely mechanical pressing at the conductive area.

The sealing method using epoxy or acrylic ultraviolet-ray-setting adhesive can be used not only in the case of LCD but also in many different cases. This method is advantageous in that heat is not necessary to cure an adhesive, and in that it can be realized by forming the substrate of transparent materials such as acrylic, polycarbonate or epoxy resins. Here, the preferable materials for connecting layers are gold-plated layer, gold-paste, tin-plated layer and others.

Figure 17:
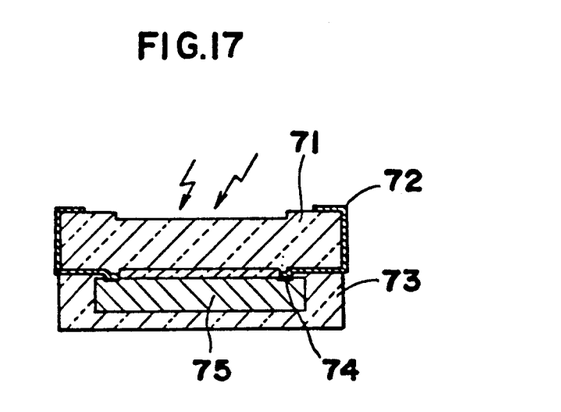
FIG. 17 represents a cross-sectional view of a further substrate on which an IC chip is mounted.
Figure 18:
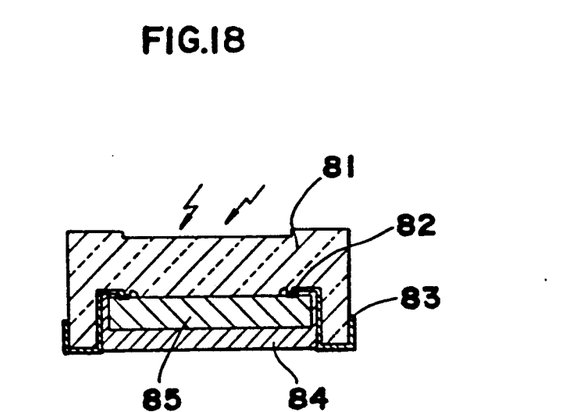
FIG. 18 represents a cross-sectional view of another substrate on which an IC chip is mounted.

FIG. 17 shows an embodiment using transparent resin as a material for a substrate 71. An IC chip 75 requiring incidence or emission of light, for example, an optical element such as SPC and LED, or an EPROM, is mounted on an optically transparent substrate 71, and the IC chip 75 is tightly sealed with a resin 73, thus producing an IC package, 74 represents a bump. To form a external electrode 72, the electrode is extended out to the upper surface. FIG. 18 represents an embodiment of mounting an IC chip 85 on a substrate 81 made of transparent resin and sealing it with resin 84. An external electrode 83 is formed by expanding an electrode out to the lower surface. 82 represents a bump.

According to the present invention, the foregoing method facilitates the formation of bumps on the molded printed circuit substrate, and the fact that common IC chips having no bumps can be directly mounted on a printed circuit substrate by the face down bonding method enables high-density mounting of IC chips, the decreased size of devices and further cost reduction.

In addition, according to this invention, since an IC chip can be mounted on a substrate only by heating and pressing when it is laid over the substrate, the mounting operation can be easy and the cost can be reduced. To mold a positioning frame integrally with a substrate facilitates the positioning operation of the IC chip and improves the mounting precision. As a substrate can be molded into a variety of shapes, the substrate itself can serve as a commercial product or a part, and the size of products can be minimized. By making the substrate of transparent materials, an IC chip can be directly mounted on a part which cannot resist heat, which widens the scope of its application. This also enables the IC chip of an optical element to be mounted and sealed with resins, and as a result, a small and inexpensive IC package of the optical element can be produced.

What is claimed is:

1. A chip mounted substrate on which an IC chip, having an exposed electrode, is mounted, comprising:
    a substrate formed of an insulating material and integrally molded with a projection on a surface thereof; a conductive pattern formed on the projection and on a necessary portion of the substrate;
    a connecting layer formed on the conductive pattern formed on the projection; and
    an IC chip fixed on the substrate while electrically connecting the exposed electrode with said conductive pattern formed on the projection through said connecting layer.

2. A chip mounted substrate as claimed in claim 1, further comprising an adhesive provided for sealing said IC chip on the substrate.

3. A chip mounted substrate as claimed in claim 1, wherein said substrate is formed as an IC card.

4. A chip mounted substrate as claimed in claim 2, wherein said adhesive is made of a hot-melt type so that said IC chip can be removed from the substrate after said IC chip has been once mounted on the substrate.

5. A chip mounted substrate as claimed in claim 2, wherein said substrate is made of a transparent material and said adhesive is made of an ultraviolet-ray-setting adhesive.

6. A chip mounted substrate as claimed in claim 1, wherein said substrate is made of a transparent material and is formed as a part of a liquid crystal device.

7. A chip mounted substrate as claimed in claim 1, further comprising a sealing member for sealing said IC chip on the substrate.

8. A chip mounted substrate as claimed in claim 1, wherein said IC chip is composed of an optical element which requires incident or emission of light.

9. A chip mounted substrate as claimed in claim 8, wherein said optical element is selected from a group including a silicon photo cell (SPC), a light emitting diode (LED), and an electrically programable read only memory (EPROM).

10. A chip mounted substrate as claimed in claim 5, wherein said connecting layer is made of solder.

11. A chip mounted substrate as claimed in claim 5, wherein said connecting layer is made by plating tin upon the conductive pattern positioned on the projection.

12. A chip mounted substrate as claimed in claim 5, wherein said connecting layer is made by plating gold upon the conductive pattern positioned on the projection.

13. A chip mounted substrate as claimed in claim 5, wherein said connecting layer is made of gold paste.

14. A chip mounted substrate as claimed in claim 5, wherein said connecting layer is made is adhesive is electrically conductive.

15. A chip mounted substrate as claimed in claim 5, further comprising adhesive tape of electrically anisotropic conductive provided on said conductive pattern and positioned on the projection.

16. A chip mounted substrate as claimed in claim 5, further comprising a frame integrally formed on the substrate with the projection, said frame being used for positioning said IC chip on the substrate.

17. A chip mounted substrate as claimed in claim 5, wherein said substrate is formed as an outside member of an electrical device.

18. A chip mounted substrate on which an IC chip, having an exposed electrode, is mounted, comprising:
a substrate formed of an insulating material and integrally molded with a pair of spaced projections on a surface thereof; a conductive pattern formed on the projections and on a necessary portion of the substrate;
a connecting layer formed on the conductive pattern formed on the projections;
an IC chip having a pair of exposed electrodes fixed on the substrate while electrically connecting the exposed electrodes with said conductive patterns formed on the projections through said connecting layer, the projections being of a sufficient height above said substrate surface to support said IC chip with a gap between said IC chip and said substrate surface, and
means extending between said projections and said gap to secure the IC chip to said substrate.

* * * * *